(12) United States Patent
Gan

(10) Patent No.: US 10,802,991 B2
(45) Date of Patent: Oct. 13, 2020

(54) PLUGGABLE MODULE IDENTIFICATION SYSTEM

(71) Applicants: Guangzhou Shiyuan Electronics Co., Ltd., Guangzhou (CN); Guangzhou Shirui Electronics Co. Ltd., Guangzhou (CN)

(72) Inventor: Heng Gan, Guangzhou (CN)

(73) Assignees: Guangzhou Shiyuan Electronics Co., Ltd., Guangzhou (CN); Guangzhou Shirui Electronics Co. Ltd., Guangzhou (CN)

(*) Notice: Subject to any disclaimer, the term of this patent is extended or adjusted under 35 U.S.C. 154(b) by 0 days.

(21) Appl. No.: 16/337,543

(22) PCT Filed: Sep. 27, 2017

(86) PCT No.: PCT/CN2017/103785
§ 371 (c)(1),
(2) Date: Mar. 28, 2019

(87) PCT Pub. No.: WO2018/107858
PCT Pub. Date: Jun. 21, 2018

(65) Prior Publication Data
US 2020/0034313 A1    Jan. 30, 2020

(30) Foreign Application Priority Data
Dec. 13, 2016  (CN) .................. 2016 2 1367555 U

(51) Int. Cl.
*G06F 13/10* (2006.01)
*G01R 31/00* (2006.01)
*G06F 13/40* (2006.01)

(52) U.S. Cl.
CPC ............. *G06F 13/10* (2013.01); *G01R 31/00* (2013.01); *G06F 13/4068* (2013.01)

(58) Field of Classification Search
CPC ...... G06F 13/10; G06F 13/4068; G01R 31/00
See application file for complete search history.

(56) References Cited

U.S. PATENT DOCUMENTS 5,660,554 A * 8/1997 Mead ..................... H01R 27/00
439/172
5,822,547 A * 10/1998 Boesch ............... G06F 13/4081
710/302

(Continued)

FOREIGN PATENT DOCUMENTS

| CN | 1209708 A | 3/1999 |
|---|---|---|
| CN | 101097520 A | 1/2008 |
| CN | 206270945 U | 6/2017 |

OTHER PUBLICATIONS

International Search Report and Written Opinion for PCT/CN2017/103785 dated Jan. 4, 2018, 10 pages.

*Primary Examiner* — Henry Tsai
*Assistant Examiner* — Christopher A Daley
(74) *Attorney, Agent, or Firm* — Zhong Law, LLC

(57) ABSTRACT

A pluggable module identification system, including: a detection device and a plurality of pluggable modules with surfaces thereof being conductors, where the detection device includes a receptor slot, a grounding assembly is provided on an inner side surface of the receptor slot at a location close to an insertion opening of the receptor slot, a detection assembly is provided on the inner side surface of the receptor slot at location close to a bottom of the receptor slot, the grounding assembly is grounded, and the detection assembly is connected to a main board.

15 Claims, 2 Drawing Sheets

(56) References Cited

U.S. PATENT DOCUMENTS

| | | | | |
|---|---|---|---|---|
| 2003/0104718 A1* | 6/2003 | Holzer | ............... | H01R 33/94 439/356 |
| 2013/0279207 A1* | 10/2013 | Yu | ............... | H02M 3/335 363/21.06 |
| 2015/0373860 A1* | 12/2015 | He | ............... | H05K 3/366 361/736 |

* cited by examiner

PLUGGABLE MODULE IDENTIFICATION SYSTEM

CROSS-REFERENCE TO RELATED APPLICATIONS

This application is a national stage of International Application No. PCT/CN2017/103785, filed on Sep. 27, 2017, which claims priority to Chinese Patent Application No. 201621367555.0, filed on Dec. 13, 2016, both of which are hereby incorporated by reference in their entireties.

TECHNICAL FIELD

The disclosure relates to the technical field of pluggable module detection, in particular to a pluggable module identification system.

BACKGROUND

With the rapid development of communication and electronic technologies, electronic devices have been widely used. For example, computers have become a necessary tool in people's life, work, and study. At present, many electronic devices are equipped with pluggable modules, which provide an interface between a computer and data communication networks such as an Ethernet or an optical network. The pluggable module can be copper-based or fiber-based.

The production process of pluggable modules typically requires the detection of the modules. When a universal interface is compatible with multiple types of pluggable modules, a host often needs to identify the type of inserted modules to apply different control strategies (such as time sequence, power supply, enablement of certain ports, etc.). There are two main methods at present:

(1) Performing handshake identification through universal buses such as USB, 12C etc. This solution requires two or more signal lines, and requires that the module, at least part of it, is in an operational state to complete bus communication;

(2) Identifying by pulling down/up one of detection ports of a host. The disadvantage of this approach is that each different module needs a separate IO port and a connecting line. When there are many types of pluggable modules, a number of the required IO ports and connectors can become very large.

SUMMARY

The present disclosure aims to solve at least one of the technical problems in the current technologies. To this end, the object of the present disclosure is to implement a pluggable module identification system without the need to use an excessive number of signal lines.

A pluggable module identification system according to an embodiment of the present disclosure includes a detection device and a plurality of pluggable modules each comprising a conductor surface, where the detection device includes a receptor slot, where a grounding assembly is provided on an inner side surface of the receptor slot at a location close to an insertion opening of the receptor slot, and a detection assembly is provided on the inner side surface of the receptor slot at a location close to a bottom of the receptor slot, where the grounding assembly is connected to the ground, and the detection assembly is connected to a main board; where the main board is at least provided with a controller, a power source and a resistor, where a first end of the resistor is connected to the power source, and a second end of the resistor is respectively connected to the controller and the detection assembly; when the pluggable module is not inserted, a voltage level of the detection assembly read by the controller is high; when the pluggable module is inserted into the receptor slot and in contact with the detection assembly, the grounding assembly is short-circuited to the detection assembly, and a voltage level of the detection assembly read by the controller is low; at least one insulator block is provided on a surface of each of the pluggable modules contacting the grounding assembly and/or the detection assembly, where any two different types of pluggable modules include different numbers of the insulator blocks, a width of any one of the insulator blocks of each of the pluggable modules is smaller than a width of the grounding assembly and greater than a width of the detection assembly.

An identification of the pluggable module of a pluggable module identification system according to an embodiment of the present disclosure may be performed based on a determination of a different number of insulator blocks on each pluggable module without using excessive signal lines. The determination is simple to implement and low in cost without requiring the usage of an ADC. It can be realized using only one GPIO port, which is very useful for controllers with limited ADC resources. An insertion detection function is integrated into an identification process, and an action of identification can be completed during an insertion process without supplying power to the modules, thereby preserving time in advance for a controller to prepare for relevant operations. The grounding assembly can also help improve the grounding performance of the module.

In addition, the pluggable module identification system according to the above embodiment of the present disclosure may further have the following additional technical features:

Further, in an embodiment of the present disclosure, two sides of the inner side surface of the receptor slot are respectively provided with a first slide rail and a second slide rail for inserting and removing the pluggable module, the grounding assembly at least includes a first conductive device and a second conductive device respectively disposed on the first sliding rail and the second sliding rail, and the detection assembly at least includes a third conductive device and a fourth conductive device respectively disposed on the first sliding rail and the second sliding rail; where a width of any of the insulator blocks of each of the pluggable modules is less than a width of the first conductive device or the second conductive device and greater than a width of the third conductive device or the fourth conductive device.

Further, in an embodiment of present disclosure, the first conductive device and the second conductive device are symmetrically disposed in the receptor slot.

Further, in an embodiment of present disclosure, the third conductive device and the fourth conductive device are symmetrically disposed in the receptor slot.

Further, in an embodiment of the present disclosure, the first conductive device, the second conductive device, the third conductive device and the fourth conductive device are elastic conductive devices.

Further, in an embodiment of the present disclosure, the controller is a programmable logic controller.

The additional aspects and advantages of the present disclosure will be set forth in part in the description which follows, and some will become apparent from the following description or will be understood by the practice of the disclosure.

BRIEF DESCRIPTION OF DRAWINGS

The above and/or additional aspects and advantages of the present disclosure will become apparent and readily understood from the description of the embodiments in conjunction with the following drawings, where.

DESCRIPTION OF EMBODIMENTS

Figure 1:
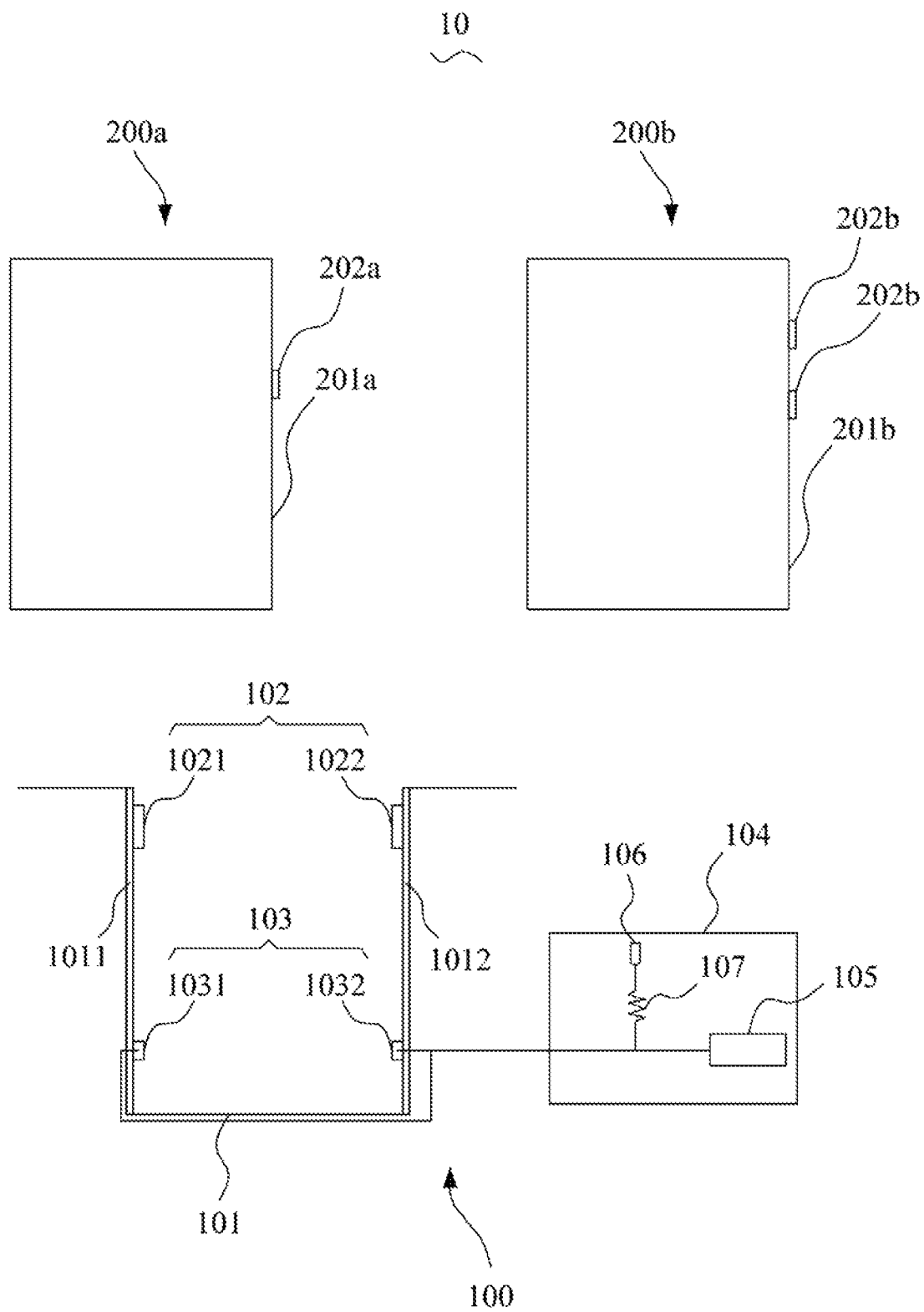
FIG. 1 is a schematic structural diagram of a pluggable module identification system according to an embodiment of the present disclosure.

In order to make the above objects, features and advantages of the present disclosure more apparent, the specific embodiments of the present disclosure will be described in detail below with reference to the accompanying drawings. Various embodiments of the disclosure are presented in the drawings. However, the present disclosure may be implemented in many different forms and is not limited to the embodiments described herein. Rather, these embodiments are provided for the purpose of making the disclosure of the disclosure more comprehensive.

It should be noted that when an element is referred to as being "fixed" to another element, it may be directly on the another element or via an intermediate element. When an element is considered to be "connected" to another element, it may be directly connected to the another element or via an intermediate element. Expressions of the terms "vertical", "horizontal", "left", "right", "upper", "lower" and the like are used for the purpose of illustration only and are not intended to indicate or imply that the device or the element must have a particular orientation, or must be constructed and operated in a particular orientation, and thus are not to be construed as limiting the disclosure.

In the present disclosure, the terms "installation", "connected", "connection", "fixed" and the like shall be understood in a broad sense, which may be, for example, a fixed connection, a detachable connection, or an integral connection; may be a mechanical connection or an electrical connection; may be directly connected or indirectly connected through an intermediate medium, and may be an internal connection of two elements. For those skilled in the art, the specific meanings of the above terms in the present disclosure may be understood on a case-by-case basis. The term "and/or" used herein includes any and all combinations of one or more of the associated listed items.

Referring to FIG. 1, a pluggable module identification system 10 according to an embodiment of the present disclosure includes a detection device 100 and a plurality of pluggable modules including conductor surfaces, where the pluggable module may be a metal pluggable module. In addition, in a practical implementation, if the pluggable module is a plastic pluggable module, a metal patch may be mounted on the surface of both sides of the plastic pluggable module before a detection, so that the surface of the pluggable module is a conductor. In this embodiment, a number of the pluggable module is two as an example for illustration, that is, a pluggable module 200a and a pluggable module 200b.

The detection device 100 includes a receptor slot 101. A grounding assembly 102 is provided on an inner side surface of the receptor slot 101 at a location close to an insertion opening of the receptor slot 101, a detection assembly 103 is provided on the inner side surface of the receptor slot 101 at a location close to a bottom of the receptor slot 101, and the grounding assembly 102 is connected to the ground. The detection assembly 103 is connected to a main board 104, where the main board 104 is provided with at least a controller 105, a power source 106 and a resistor 107, where a first end of the resistor 107 is connected to the power source 106, and a second end of the resistor 107 is respectively connected to the controller 105 and the detection assembly 103. The controller 105 is a programmable logic controller, and may specifically be a single chip microcomputer or a DSP processor, or an ARM processor, or an FPGA controller or a PLC. When the pluggable module 200a is not inserted (taking the pluggable module 200 as an example for illustration), a voltage level of the detection assembly 103 read by the controller 105 is high. When the pluggable module 200a is inserted into the receptor slot 101 and is in contact with the detection assembly 103, the grounding assembly 102 is short circuited to the detection assembly 103, and a voltage level of the detection assembly 103 read by the controller 105 is low.

In addition, it may be understood that, in the case where the controller 105 has a built-in pull-up resistor, the power source 106 and the resistor 107 can be eliminated as long as a changing voltage level can be achieved.

At least one insulator block is provided on a surface of each of the pluggable modules contacting the grounding assembly 102 and/or the detection assembly 103, and any two different types of pluggable modules include different numbers of the pluggable modules, a width of any one of the insulator blocks of each pluggable module is smaller than a width of the grounding assembly 102 to ensure that the pluggable module is well grounded during the overall detection process, a width of any one of the insulator blocks of each pluggable module is greater than a width of the detection assembly 103 to ensure a smooth operation of the detection process. Specifically, in the embodiment, one insulator block 202a is provided on a surface 201a of the pluggable modules 200a contacting the grounding assembly 102 and/or the detection assembly 103, two insulator blocks 202b are provided on a surface 201b of the pluggable modules 200b contacting the grounding assembly 102 and/or the detection assembly 103, and the widths of the insulator block 202a and the insulator block 202b are both smaller than the width of the grounding assembly 102, and are both greater than the width of the detection assembly 103. In practice, the widths of the insulator block 202a and the insulator block 202b may be the same or different, which is not limited herein. In this embodiment, the widths of the insulator block 202a and the insulator block 202b being the same are taken as an example.

According to the pluggable module identification system of the embodiment of the present disclosure, when the pluggable module 200a (taking the pluggable module 200a as an example for illustration) is not inserted, the detection assembly 103 is pulled up to a high voltage level due to a pull-up function of the resistor 107. Accordingly, a voltage level read by the controller 105 at this time is high. After the pluggable module 200a is inserted and in contact with the detection assembly 103, since the surface of the pluggable module 200a is a conductor, the grounding assembly 102 and the detection assembly 103 are short circuited. Since the grounding assembly 102 is grounded, a voltage level read by the controller 105 at this time is low. A change from a high level to a low level of the level read by the controller 105 may be used to identify an insertion of the pluggable module 200a. The entire detection process does not require any wire connection operation on the pluggable module 200a, thereby realizing the effect of detection before connecting.

Figure 2:
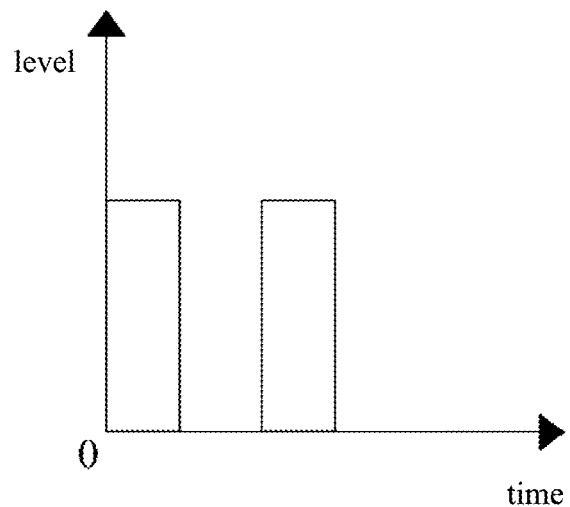
FIG. 2 is a schematic diagram showing a voltage level change of a pluggable module identification system during an insertion of a pluggable module 200a according to an embodiment of the present disclosure.
Figure 3:
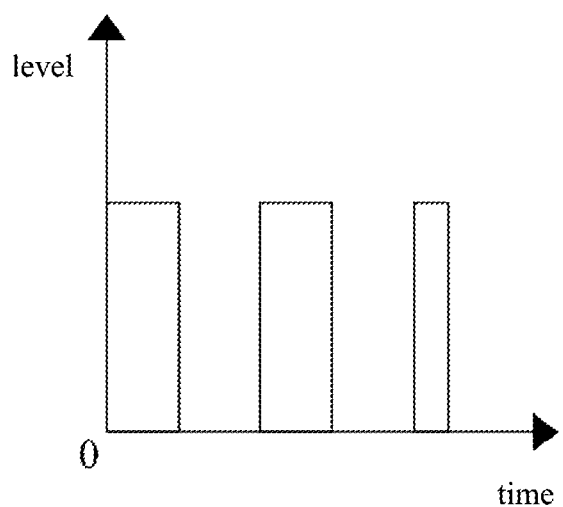
FIG. 3 is a schematic diagram showing a voltage level change of the pluggable module identification system during an insertion of a pluggable module 200b according to an embodiment of the present disclosure.

Further, due to the function of insulator blocks, and a different number of insulator blocks on surfaces of both the pluggable module 200a and the pluggable module 200b, changes of detected voltage levels of the two pluggable modules are different. Referring to FIG. 2 and FIG. 3, during a detection of a pluggable module 200a, a voltage level changes from high to low then to high in a process while the pluggable module 200a is from not being inserted to being fully inserted; during a detection of a pluggable module 200b, a level changes from high to low, then to high, then to low, and finally to high in a process while the pluggable module 200b is from not being inserted to being fully inserted.

At the same time, in order to determine a detection end time and avoid erroneous determination, either of the following two methods may be used:

(1) Starting a timer when a controller detects that a detection signal is pulled down, setting a fixed length of time for detection, and stopping a determination when the timer expires.

(2) Adding a signal pin to a docking socket between a pluggable module and a host to determine whether an insertion process is completed, where the detection method thereof is consistent with the general insertion detection scheme of an IO port.

Preferably, the above insulator blocks may also be provided with different widths according to an order to contact the detection assembly to screen out unnecessary pulses during repeated insertion and removal. At the same time, it is also possible to perform an identification of the insertion/unplugging process, that is, to perform an identification of a movement direction of a pluggable module.

According to a pluggable module identification system of an embodiment of the present disclosure, an identification of the pluggable module may be performed based on a different number of insulator blocks on each pluggable module without using excessive number of signal lines. In a practical implementation, only two signal lines may be required. It is simple to implement and low in cost. It does not require an ADC therein, and can be realized with only one GPIO port, which is very useful for controllers with limited ADC resources. An insertion detection function is integrated into an identification process, and a consumption of controller resources for polling and corresponding interruptions during a non-insertion process can be avoided. An action of identification can be completed during an insertion process without supplying power to the modules, thereby preserving time in advance for a controller to prepare for relevant operations. The grounding assembly can also help improve the grounding performance of the module.

Still referring to FIG. 1, as a specific example, two sides of the inner side surface of the receptor slot 101 are respectively provided with a first sliding rail 1011 and a second slide rail 1012 for inserting and removing the pluggable module 200a (taking the pluggable module 200a as an example for illustration).

The grounding assembly 102 includes at least a first conductive device 1021 and a second conductive device 122 respectively disposed on the first sliding rail 1011 and the second sliding rail 1012. The first conductive device 1021 and the second conductive device 1022 are both grounded.

The detection assembly 103 includes at least a third conductive device 1031 and a fourth conductive device 1032 respectively disposed on the first sliding rail 1011 and the sliding rail 1012.

Further, in the embodiment, the first conductive device 1021 and the second conductive device 1022 are symmetrically disposed in the receptor slot 101, and the third conductive device 1031 and the fourth conductive device 1032 are symmetrically disposed in the receptor slot 101. Specifically, a height of the first conductive device 1021 in the receptor slot 101 is the same as a height of the second conductive device 1022 in the receptor slot 101, and a height of the third conductive device 1031 in the receptor slot 101 is the same as a height of the fourth conductive device 1032 in the receptor slot 101, avoiding a force placed on the first sliding rail 1011 being inconsistent with a force on the second slide rail 1012.

Further, the first conductive device 1021 is any one of a metal pin, an elastic metal plate and a conductive foam. Specifically, in the embodiment, the first conductive device 1021 is an elastic metal plate, and materials of the first conductive device 1021, the second conductive device 1022, the third conductive device 1031 and the fourth conductive device 1032 are the same, that is, the elastic metal plate.

In addition, the first conductive device 1021, the second conductive device 1022, the third conductive device 1031 and the fourth conductive device 1032 are all elastic conductive devices. The self-deformation of the elastic conductive devices can reduce the difficulty of plugging or looseness of the pluggable module 200a caused by structural variations.

In the description of the present specification, the description of the reference terms "one embodiment", "some embodiments", "example", "specific example", or "some examples" and the like means that a specific feature, structure, material or character described in connection with the embodiment or example is included in at least one embodiment or example of the disclosure. In the present specification, the illustrative representation of the above terms does not necessarily refer to the same embodiment or example. Furthermore, the particular features, structures, materials, or characteristics described may be combined in a suitable manner in any one or more embodiments or examples.

The above-mentioned embodiments are merely illustrative of several implementations of the present disclosure, and the description thereof is more specific and detailed, but is not to be construed as limiting the scope of the present disclosure. It should be noted that a number of variations and modifications may be made by those skilled in the art without departing from the spirit and scope of the disclosure. Therefore, the scope of the disclosure should be subject to the appended claims.

What is claimed is:

1. A pluggable module identification system, comprising:
a detection device; and
a plurality of pluggable modules each capable of coupling with the detection device,
wherein each of the plurality of pluggable modules comprises a respective conductor surface on which at least one insulator block is provided, and a type associated with each of the plurality of pluggable module is uniquely identified by a total number of the at least one insulator block provided on the conductor surface,
wherein the detection device comprises a receptor slot to detect the type associated with each of the plurality of pluggable module by determining the total number of the at least one insulator blocks, and wherein two different types of pluggable modules are provided with two different total numbers of the at least one insulator block on corresponding conductor surfaces.

2. The pluggable module identification system according to claim 1, wherein a grounding assembly is provided on an inner side surface of the receptor slot at a location close to an insertion opening of the slot, and a detection assembly is provided on the inner side surface of the receptor slot at a location close to a bottom of the slot, wherein the grounding assembly is grounded, and the detection assembly is connected to a main board;

wherein the main board is at least provided with a controller, a power source and a resistor, wherein a first end of the resistor is connected to the power source, and a second end of the resistor is respectively connected to the controller and the detection assembly; and wherein the at least one insulator block is provided on a surface of each of the pluggable modules contacting the grounding assembly and/or the detection assembly, a width of any one of the insulator blocks of each of the plurality of pluggable modules is smaller than a width of the grounding assembly and greater than a width of the detection assembly.

3. The pluggable module identification system according to claim 2, wherein two sides of the inner side surface of the receptor slot are respectively provided with a first slide rail and a second slide rail for inserting and removing a pluggable module, the grounding assembly at least comprises a first conductive device and a second conductive device respectively disposed on the first sliding rail and the second sliding rail, and the detection assembly at least comprises a third conductive device and a fourth conductive device respectively disposed on the first sliding rail and the second sliding rail; wherein a width of any of the insulator blocks of each of the plurality of pluggable modules is smaller than a width of the first conductive device or the second conductive device and greater than a width of the third conductive device or the fourth conductive device.

4. The pluggable module identification system according to claim 3, wherein the first conductive device and the second conductive device are symmetrically disposed in the receptor slot.

5. The pluggable module identification system according to claim 3, wherein the third conductive device and the fourth conductive device are symmetrically disposed in the receptor slot.

6. The pluggable module identification system according to claim 2, wherein the first conductive device, the second conductive device, the third conductive device and the fourth conductive device are elastic conductive devices.

7. The pluggable module identification system according to claim 2, wherein the controller is a programmable logic controller.

8. A detection device for receiving and identifying different types of pluggable modules, comprising:
a receptor slot to receive one of the different types of pluggable module;
a grounding assembly provided on an inner surface of the receptor slot at a location close to an insertion opening of the receptor slot; and
a detection assembly provided on the inner surface of the receptor slot at a location close to a bottom of the receptor slot, wherein the grounding assembly is to be connected to a ground, and the detection assembly is to be connected to a main board,
wherein when a pluggable module is not inserted, a voltage level of the detection assembly read by the controller is high, when the pluggable module is inserted into the receptor slot and in contact with the detection assembly, the grounding assembly is short circuited to the detection assembly, and a voltage level of the detection assembly read by the controller is low, and wherein the detection assembly is to detect a type of a pluggable module by determining a total number of insulator blocks in the pluggable module, and any two different types of pluggable modules comprise two different total numbers of the insulator blocks.

9. The detection device according to claim 8, wherein the main board is at least provided with a controller, a power source and a resistor, wherein a first end of the resistor is connected to the power source, and a second end of the resistor is respectively connected to the controller and the detection assembly.

10. The detection device according to claim 8, wherein a width of any one of the insulator blocks of each of the pluggable modules is smaller than a width of the grounding assembly and greater than a width of the detection assembly.

11. The detection device according to claim 8, wherein the controller is a programmable logic controller.

12. The detection device according to claim 8, wherein two sides of the inner side surface of the receptor slot are respectively provided with a first slide rail and a second slide rail for inserting and removing the pluggable module, the grounding assembly at least comprises a first conductive device and a second conductive device respectively disposed on the first sliding rail and the second sliding rail, and the detection assembly at least comprises a third conductive device and a fourth conductive device respectively disposed on the first sliding rail and the second sliding rail; wherein a width of any of the insulator blocks of each of the pluggable modules is smaller than a width of the first conductive device or the second conductive device and greater than a width of the third conductive device or the fourth conductive device.

13. The detection device according to claim 12, wherein the first conductive device and the second conductive device are symmetrically disposed in the receptor slot.

14. The detection device according to claim 12, wherein the third conductive device and the fourth conductive device are symmetrically disposed in the receptor slot.

15. A detection device for receiving and identifying different types of pluggable modules, comprising:
a receptor slot to receive one of the different types of pluggable module; and
a detection assembly provided on an inner surface of the receptor slot to detect a type of a pluggable module inserted into the receptor slot by determining a total number of insulator blocks in the pluggable module, wherein two different types of pluggable modules comprise two different total numbers of the insulator blocks.

* * * * *